US009105987B2

(12) United States Patent
Nakano et al.

(10) Patent No.: US 9,105,987 B2
(45) Date of Patent: Aug. 11, 2015

(54) CONNECTION STRUCTURE

(71) Applicant: MURATA MANUFACTURING CO., LTD., Nagaokakyo-Shi, Kyoto-fu (JP)

(72) Inventors: Kosuke Nakano, Nagaokakyo (JP); Hidekiyo Takaoka, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 182 days.

(21) Appl. No.: 13/917,706

(22) Filed: Jun. 14, 2013

(65) Prior Publication Data
US 2013/0270001 A1    Oct. 17, 2013

Related U.S. Application Data

(63) Continuation of application No. PCT/JP2012/052653, filed on Feb. 7, 2012.

(30) Foreign Application Priority Data

Feb. 9, 2011    (JP) .................... 2011-025952

(51) Int. Cl.
*H05K 1/09*        (2006.01)
*H01R 4/02*        (2006.01)
(Continued)

(52) U.S. Cl.
CPC ............... *H01R 4/02* (2013.01); *B23K 35/025* (2013.01); *B23K 35/0244* (2013.01); *B23K 35/262* (2013.01); *B23K 35/302* (2013.01); *C22C 1/0425* (2013.01); *C22C 9/02* (2013.01); *C22C 9/05* (2013.01); *C22C 9/06* (2013.01); *C22C 13/00* (2013.01); *C22C 19/03* (2013.01); *C22C 22/00* (2013.01); *H05K 3/3463* (2013.01); *B23K 2201/36* (2013.01); *H05K 3/3484* (2013.01);
(Continued)

(58) Field of Classification Search
None
See application file for complete search history.

(56) References Cited

U.S. PATENT DOCUMENTS 4,646,811 A * 3/1987 Morishita et al. ............ 164/103
5,863,493 A * 1/1999 Achari et al. ................ 420/557
(Continued)

FOREIGN PATENT DOCUMENTS

| CN | 1033956 A | 7/1989 |
|---|---|---|
| CN | 1235079 A | 11/1999 |

(Continued)

OTHER PUBLICATIONS

PCT/JP2012/052653 Written Opinion dated Apr. 18, 2012.
(Continued)

*Primary Examiner* — Tuan T Dinh
*Assistant Examiner* — Steven T Sawyer
(74) *Attorney, Agent, or Firm* — Arent Fox LLP

(57) ABSTRACT

A connection structure that includes a region where at least a Cu—Sn intermetallic compound, a M-Sn intermetallic compound and a Cu-M-Sn intermetallic compound (where M is Ni and/or Mn) exist in a cross-section of a connecting part when the cross-section of the connecting part is analyzed with a WDX. Further, the connection structure is configured so that when the cross-section of the connecting part is evenly divided into ten sections in a vertical direction and a lateral direction, respectively, to form 100 segmentalized squares in total, a ratio of the number of squares in which two or more kinds of intermetallic compounds having different constituent elements exist to the number of all the squares, except for squares in which only a Sn-based metal component exists, is 70% or more.

10 Claims, 5 Drawing Sheets

(51) Int. Cl.
*B23K 35/02* (2006.01)
*B23K 35/26* (2006.01)
*B23K 35/30* (2006.01)
*C22C 9/02* (2006.01)
*C22C 9/05* (2006.01)
*C22C 9/06* (2006.01)
*C22C 13/00* (2006.01)
*C22C 19/03* (2006.01)
*C22C 22/00* (2006.01)
*H05K 3/34* (2006.01)
*C22C 1/04* (2006.01)

(52) U.S. Cl.
CPC ............ *H05K 2201/0272* (2013.01); *H05K 2201/10636* (2013.01)

(56) References Cited

U.S. PATENT DOCUMENTS

| | | | |
|---|---|---|---|
| 6,229,248 | B1 | 5/2001 | Kusabiraki et al. |
| 7,075,183 | B2 | 7/2006 | Soga et al. |
| 7,988,908 | B2 | 8/2011 | Lee et al. |
| 8,281,978 | B2 | 10/2012 | Ikeda et al. |
| 2002/0100986 | A1 | 8/2002 | Soga et al. |
| 2002/0114726 | A1 | 8/2002 | Soga et al. |
| 2003/0224197 | A1* | 12/2003 | Soga et al. .................... 428/570 |
| 2004/0126269 | A1* | 7/2004 | Nozawa et al. ................ 420/558 |
| 2007/0031279 | A1 | 2/2007 | Soga et al. |
| 2007/0245852 | A1* | 10/2007 | Takaoka et al. ................. 75/255 |
| 2008/0122050 | A1* | 5/2008 | Ikeda et al. .................... 257/669 |
| 2009/0014855 | A1 | 1/2009 | Miyaki et al. |
| 2009/0134016 | A1* | 5/2009 | Belanger et al. ......... 204/192.25 |
| 2010/0246148 | A1 | 9/2010 | Ikeda et al. |
| 2010/0266870 | A1 | 10/2010 | Nishimura |
| 2011/0058980 | A1 | 3/2011 | Lee et al. |

FOREIGN PATENT DOCUMENTS

| | | |
|---|---|---|
| CN | 1309425 A | 8/2001 |
| CN | 101048521 A | 10/2007 |
| CN | 101884254 A | 11/2010 |
| JP | 10-193172 | 7/1998 |
| JP | 2002-254194 A | 9/2002 |
| JP | 5018978 B1 | 9/2012 |
| KR | 100950686 B1 | 3/2010 |
| WO | WO-2006-075459 A1 | 7/2006 |
| WO | WO-2009-051255 A1 | 4/2009 |

OTHER PUBLICATIONS

PCT/JP2012/052653 ISR dated Apr. 18, 2012.
Japanese Office Action for corresponding application JP 2012-556884, dispatch date Jun. 17, 2014 (with English translation).

* cited by examiner

US 9,105,987 B2

CONNECTION STRUCTURE

CROSS REFERENCE TO RELATED APPLICATIONS

The present application is a continuation of International application No. PCT/JP2012/052653, filed Feb. 7, 2012, which claims priority to Japanese Patent Application No. 2011-025952, filed Feb. 9, 2011, the entire contents of each of which are incorporated herein by reference.

FIELD OF THE INVENTION

The present invention relates to a connection structure in which a first connecting object is connected to a second connecting object with a connecting part interposed therebetween, and to a connection structure that is applied to the case of mounting of electronic parts or via connection, for example, in which a first connecting object is connected to a second connecting object by using a solder as a conductive joining material.

BACKGROUND OF THE INVENTION

For example, in the manufacture of electronic equipment including the kind of semiconductor device in which a chip is die bonded or a semiconductor device which is subjected to flip-chip bonding, a bonding method with temperature hierarchy is applied, in which connection by soldering at a relatively high temperature using a high temperature solder is performed in a semiconductor device, and then the semiconductor device itself is connected to a substrate by soldering at a relatively low temperature using a low temperature solder having a lower melting point than the high temperature solder.

In performing the solder connection on a high temperature side in the bonding method with temperature hierarchy, a Pb solder was often used in the past, but recently, a Pb-free solder not containing Pb has been frequently used because of concerns about a detrimental effect of Pb on the environment. Examples of a Pb-free solder material which is of interest in the present invention include a solder paste proposed in Japanese Patent Laid-open Publication No. 2002-254194 (Patent Document 1), which includes a mixture of (a) a high melting point metal (or alloy) ball made of a metal such as Cu, Al, Au or Ag, or an alloy containing these metals and (b) a low melting point metal ball made of Sn or In.

When soldering is performed by using the solder paste described in Patent Document 1, as shown schematically in FIG. 6(1), a solder paste 53 including low melting point metal balls 51 made of, for example, Sn, high melting point metal balls 52 made of, for example, Cu and a flux (not shown) reacts by heating, and after soldering, as shown in FIG. 6(2), a connecting part 55 in a state where a plurality of high melting point metal balls 52 are connected to one another with an intermetallic compound, formed between a low melting point metal derived from the low melting point metal ball 51 and a high melting point metal derived from the high melting point metal ball 52, interposed therebetween is formed to give a connection structure in which connecting objects (not shown) are connected to each other by the connecting part 55. A region where an intermetallic compound is produced is shown as an intermetallic compound region 54 in FIG. 6(2).

However, in the above-mentioned connection structure obtained by using a solder paste, when the connecting part is loaded with stress due to distortion resulting from a difference in the coefficient of linear expansion generated by thermal shock or the like, this may result in a problem that a crack is produced in the connecting part, and breaking of wire due to the crack causes an increase in resistance or deterioration of joint strength. This situation will be described in more detail in reference to FIG. 7.

In FIG. 7, a connection structure 60, in which a first connecting object 61 and a second connecting object 62, respectively made of Cu, are connected to each other with a connecting part 63 interposed therebetween, is schematically shown. While the solder paste used in forming the connecting part 63 includes a Cu ball, a Sn ball and a flux as described in Patent Document 1, by heating, the solder paste is put into a state where a plurality of Cu balls 64 are connected to one another between the connecting objects 61 and 62 with a Cu—Sn intermetallic compound, formed between Cu and Sn, interposed between the Cu balls 64.

More specifically, as shown by a heavy line, $Cu_3Sn$ layers 65 are formed in such a way as to lie along interfaces between the connecting part 63 and the connecting object 61, and between the connecting part 63 and the connecting object 62, and as to surround the Cu balls 64. Further, a $Cu_6Sn_5$ matrix 66 is formed in such a way as to surround the Cu balls 64. Moreover, a Sn matrix 67 derived from the Sn ball remains in the connecting part 63 particularly under common heating conditions in which a long period of heating at a high temperature is not provided.

However, in the connection structure 60 shown in FIG. 7, when the connecting part 63 is loaded with stress due to distortion resulting from a difference in the coefficient of linear expansion generated by thermal shock or the like, stress is apt to be concentrated at a location, for example, interior of the Cu—Sn intermetallic compound such as the $Cu_3Sn$ layer 65 and the $Cu_6Sn_5$ matrix 66, an interface between the $Cu_3Sn$ layers 65, an interface between the $Cu_6Sn_5$ matrixes 66, or an interface between the $Cu_3Sn$ layer 65 and the $Cu_6Sn_5$ matrix 66. Further, the Cu—Sn intermetallic compound itself has mechanically hard and brittle properties. For these reasons, as described above, when the connecting part 63 is loaded with stress, this results in a problem that a crack is easily produced in the connecting part 63.

Patent Document 1: Japanese Patent Laid-open Publication No. 2002-254194

SUMMARY OF THE INVENTION

Hence, it is an object of the present invention to provide a connection structure as to which reliability of joint strength is hardly impaired even by thermal shock.

As described above, in the case of the solder paste described in Patent Document 1, an intermetallic compound is produced between a high melting point metal and a low melting point metal by heating the solder paste in a soldering step, but only a Cu—Sn intermetallic compound composed of Cu and Sn as constituent elements is produced as an intermetallic compound, for example, when Cu is used as a high melting point metal and Sn is used as a low melting point metal. The present inventor presumes that the above-mentioned problem of crack results from the fact that only the Cu—Sn intermetallic compound is produced as described above, and consequently made the present invention.

To put it simply, the present invention is characterized by bringing various intermetallic compounds into a dispersed state in the connecting part to make the crack harder to produce in a portion of the intermetallic compound.

In addition, in the technique described in Patent Document 1, when a metal containing a component other than Sn such as Sn—Ag—Cu is employed as a low melting point metal, an intermetallic compound including other constituent elements such as a Ag—Sn intermetallic compound can also be produced, but only a slight amount of this intermetallic compound exists in the Cu—Sn intermetallic compound because a reaction between Cu and Sn preferentially takes place. Accordingly, also in this case, the problem that a crack is easily produced cannot be necessarily avoided.

The present invention is directed to a connection structure in which a first connecting object is connected to a second connecting object with a connecting part interposed therebetween, and is characterized by having the following constitutions in order to solve the above-mentioned technical problem.

A first characteristic is that at least a Cu—Sn intermetallic compound, a M-Sn intermetallic compound (M is Ni and/or Mn) and a Cu-M-Sn intermetallic compound exist in a cross-section of the connecting part when the cross-section of the connecting part is analyzed with a wavelength dispersive X-ray spectrometer (WDX). These intermetallic compounds are inevitably produced in using a Sn-based metal and a Cu-M alloy.

Further, a second characteristic is that when the cross-section of the connecting part is evenly divided into ten sections in a vertical direction and a lateral direction, respectively, to form 100 segmentalized squares in total, a ratio (hereinafter, sometimes referred to as a "dispersion degree") of the number of squares in which two or more kinds of intermetallic compounds having different constituent elements exist to the number of all squares except for squares in which only a Sn-based metal component exists in one square is 70% or more.

The above-mentioned phrase "squares except for squares in which only a Sn-based metal component exists" is, in other words, squares in which the intermetallic compound exists.

Further, the above-mentioned term "intermetallic compounds having different constituent elements" means intermetallic compounds made of, for example, a Cu—Mn—Sn intermetallic compound and a Cu—Sn intermetallic compound. For example, since $Cu_6Sn_5$ and $Cu_3Sn$ are intermetallic compounds having the same constituent elements (that is, Cu and Sn), these are counted as one kind. Further, the phrase "two or more kinds" refers to two or more kinds including not only three kinds of the above-mentioned Cu—Sn, M-Sn and Cu-M-Sn intermetallic compounds, but also other intermetallic compounds (for example, a Ag—Sn intermetallic compound).

Cu-M alloy grains are preferably dispersed in the connecting part. The Cu-M alloy grains have the effect of stress relaxation. Therefore, the connection reliability of the connecting part can be more improved.

Further, preferably, the connecting part does not contain a Sn-based metal component, and even if the connecting part contains the Sn-based metal component, it is preferred that the content of the Sn-based metal component is set to 30% by volume or less. The Sn-based metal component can be remelted and flown out when being placed, for example, in a high-temperature environment of 300° C. or higher, leading to a reduction in the heat resistance of the connecting part. Therefore, by setting the content of the Sn-based metal component to 30% by volume or less, the heat resistance of the connecting part can be improved, and by forming the connecting part in such a way that it does not contain the Sn-based metal component, the heat resistance can be more improved.

In accordance with the present invention, stress concentration hardly occurs since at least three kinds of intermetallic compounds such as a Cu—Sn intermetallic compound, a M-Sn intermetallic compound and a Cu-M-Sn intermetallic compound exist in the cross-section of the connecting part and the intermetallic compounds are in a state of being well dispersed as the dispersion degree of the intermetallic compounds in the connecting part is 70% or more. Accordingly, even if the connecting part is loaded with stress due to distortion resulting from a difference in the coefficient of linear expansion generated by thermal shock or the like, a crack is hardly produced, and this makes it possible that problems of an increase in resistance or deterioration of joint strength hardly arise.

DETAILED DESCRIPTION OF THE INVENTION

[First Embodiment]

Figure 1:
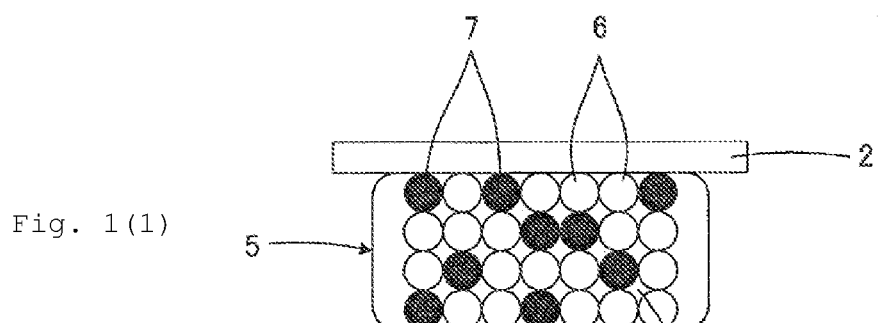
FIGS. 1(1) to 1(3) are sectional views schematically showing a connection structure 1 according to a first embodiment of the present invention, and a process for attaining the connection structure 1.
Figure 1:
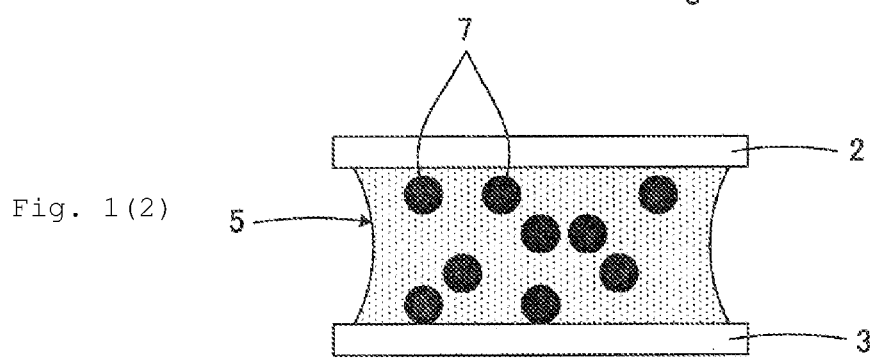
Figure 1:
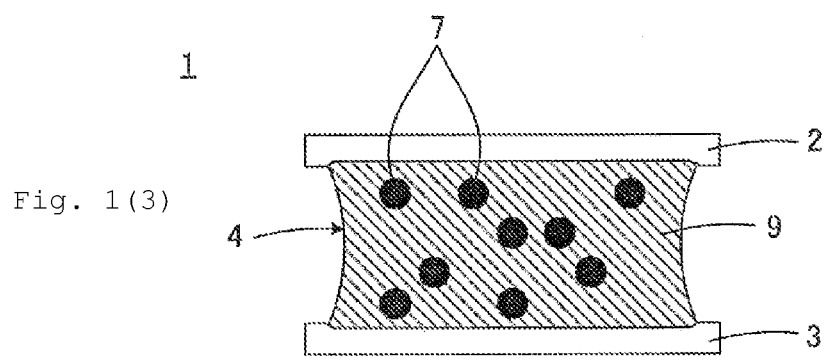

In reference to FIGS. 1(1) to 1(3), a connection structure 1 according to a first embodiment of the present invention will be described. The connection structure 1 shown in FIG. 1(3) is obtained after undergoing the process from FIG. 1(1) to FIG. 1(2). As shown in FIG. 1(3), the connection structure 1 has a structure in which a first connecting object 2 is connected to a second connecting object 3 with a connecting part 4 interposed therebetween.

In order to obtain the connection structure 1, first, a solder paste 5 is provided between the first connecting object 2 and the second connecting object 3, as shown in FIG. 1(1). The solder paste 5 includes metal components consisting of a low melting point metal powder 6 of a Sn-based metal and a high melting point metal powder 7 of a Cu-based metal having a higher melting point than that of the Sn-based metal, and a flux 8.

A Sn-based metal is Sn alone or an alloy containing Sn in an amount of 70% by weight or more, and preferably 85% by weight or more. More specifically, the Sn-based metal is desirably Sn alone or an alloy containing Sn and at least one selected from the group consisting of Cu, Ni, Ag, Au, Sb, Zn, Bi, In, Ge, Al, Co, Mn, Fe, Cr, Mg, Mn, Pd, Si, Sr, Te and P. By selecting the Sn-based metal having such a composition, it is possible to facilitate the formation of an intermetallic compound between the Sn-based metal and the Cu-based metal.

On the other hand, the Cu-based metal can produce an intermetallic compound exhibiting a melting point of 310° C. or more preferably in combination with the above-mentioned Sn-based metal by heating/melting of the solder paste 5, and the Cu-based metal is preferably a Cu—Mn alloy or a Cu—Ni alloy. When the Cu-based metal is a Cu—Mn alloy, the proportion of Mn in the alloy is preferably 10 to 15% by weight, and when the Cu-based metal is a Cu—Ni alloy, the proportion of Ni in the alloy is preferably 10 to 15% by weight.

By selecting the Cu-based metal having the above-mentioned composition, it is possible to facilitate the formation of an intermetallic compound between the Cu-based metal and the Sn-based metal at a lower temperature and in a shorter time, and it is also possible to prevent a metal from melting in a reflow step which can be performed later.

The Cu-based metal may contain impurities to such an extent that a reaction of the Cu-based metal with the Sn-based metal is not inhibited, for example, at a rate of 1% by weight or less. Examples of the impurities include Zn, Ge, Ti, Sn, Al, Be, Sb, In, Ga, Si, Ag, Mg, La, P, Pr, Th, Zr, B, Pd, Pt, Ni, and Au.

When considering the ability to be connected or reactivity of the metal powders, the oxygen concentration in the low melting point metal powder 6 and the high melting point metal powder 7 is preferably 2000 ppm or less, and particularly preferably 10 to 1000 ppm.

Further, the Cu-based metal is preferably a metal or an alloy, the lattice constant of which shows a lattice constant difference of 50% or more from the lattice constant of an intermetallic compound first produced at the circumference of the low melting point metal powder 6. The "lattice constant difference" is defined as a value (%) determined by subtracting the lattice constant of the Cu-based metal from the lattice constant of the intermetallic compound and dividing the obtained value by the lattice constant of the Cu-based metal, followed by multiplying an absolute value of the obtained value by 100, as shown in the formula shown later. That is, the lattice constant difference shows how much difference there is between the lattice constant of an intermetallic compound first produced at the interface with the Cu-based metal and the lattice constant of the Cu-based metal, and it does not matter which lattice constant is greater.

The lattice constant difference is expressed by the following formula:

$$\text{Lattice constant difference (\%)}=\{|(\text{Lattice constant of intermetallic compound}-\text{Lattice constant of Cu-based metal})|/\text{Lattice constant of Cu-based metal}\}\times 100.$$

The solder paste 5 preferably contains the flux 8. The flux 8 has the function to eliminate an oxide layer on the surface of the connecting object or the metal powder. However, the solder paste 5 is not necessarily required to contain the flux 8 and can be applied to a connecting method not requiring the flux 8. For example, a method of heating while pressurizing a connecting object or a method of heating a connecting object in a strongly reducing atmosphere can also eliminate the oxide layer on the surface of the connecting object or the metal powder to enable highly reliable connection. In addition, when the solder paste 5 contains the flux 8, it preferably contains the flux 8 in the proportion of 7 to 15% by weight with respect to the whole solder paste 5.

Publicly known materials including a vehicle, a solvent, a thixotropic agent, an activator and the like can be used as the flux 8 contained in the solder paste 5.

Specific examples of the vehicle include rosin-based resins made of rosin and derivatives such as modified rosin obtained by modifying the rosin, synthetic resins, and mixtures thereof. Specific examples of the rosin-based resin made of rosin and derivatives such as modified rosin obtained by modifying the rosin include gum rosin, tall rosin, wood rosin, polymerized rosin, hydrogenated rosin, formylated rosin, rosin esters, rosin-modified maleic resins, rosin-modified phenol resins, rosin-modified alkyd resins and various kinds of other rosin derivatives. Specific examples of the synthetic resin made of rosin and derivatives such as modified rosin obtained by modifying the rosin include polyester resins, polyamide resins, phenoxy resins and terpene resins.

Further, as the solvent, alcohols, ketones, esters, ethers, aromatic solvents and hydrocarbons are known, and specific examples thereof include benzyl alcohol, ethanol, isopropyl alcohol, butanol, diethylene glycol, ethylene glycol, glycerin, ethyl cellosolve, butyl cellosolve, ethyl acetate, butyl acetate, butyl benzoate, diethyl adipate, dodecane, tetradecene, α-terpineol, terpineol, 2-methyl-2,4-pentanediol, 2-ethylhexanediol, toluene, xylene, propylene glycol monophenyl ether, diethylene glycol monohexyl ether, ethylene glycol monobutyl ether, diethylene glycol monobutyl ether, diisobutyl adipate, hexylene glycol, cyclohexane dimethanol, 2-terpinyloxy ethanol, 2-dihydroterpinyloxy ethanol and mixtures thereof.

Specific examples of the thixotropic agent include hardened castor oil, carnauba wax, amides, hydroxy fatty acids, dibenzylidene sorbitol, bis(p-methylbenzylidene)sorbitols, bees wax, amide stearate and ethylenebisamide hydroxystearate. Further, materials obtained by adding a fatty acid such as caprylic acid, lauric acid, myristic acid, palmitic acid, stearic acid or behenic acid, a hydroxy fatty acid such as 1,2-hydroxystearic acid, an antioxidant, a surfactant, an amine or the like to the above-mentioned substances as required may also be used as the thixotropic agent.

Examples of the activators include hydrohalide salts of amines, organic halogen compounds, organic acids, organic amines and polyhydric alcohols.

Specific examples of the hydrohalide salts of amines as the activator include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, and monoethanolamine hydrobromide.

Specific examples of the organic halogen compounds as the activator include paraffin chloride, tetrabromoethane, dibromopropanol, 2,3-dibromo-1,4-butanediol, 2,3-dibromo-2-butene-1,4-diol and tris(2,3-dibromopropyl)isocyanurate.

Specific examples of the organic acid as the activator include malonic acid, fumaric acid, glycolic acid, citric acid, malic acid, succinic acid, phenylsuccinic acid, maleic acid, salicylic acid, anthranilic acid, glutaric acid, suberic acid, adipic acid, sebacic acid, stearic acid, abietic acid, benzoic acid, trimellitic acid, pyromellitic acid and dodecanoic acid, and specific examples of the organic amine include monoethanolamine, diethanolamine, triethanolamine, tributylamine, aniline and diethylaniline.

Examples of the polyhydric alcohol as the activator include erythritol, pyrogallol and ribitol.

As the flux 8, one containing at least one material selected from the thermosetting resin group consisting of an epoxy resin, a phenol resin, a polyimide resin, a silicone resin or a modified silicone resin and an acrylic resin or at least one material selected from the thermoplastic resin group consisting of a polyamide resin, a polystyrene resin, a polymethacrylic resin, a polycarbonate resin and a cellulose resin may be used.

Next, the solder paste 5 is heated in the state shown in FIG. 1(1), and when the temperature of the solder paste 5 reaches the melting point of the Sn-based metal composing the low melting point metal powder 6 or higher, the low melting point metal powder 6 is melted and loses the form of powder as shown in FIG. 1(2).

Thereafter, the solder paste 5 is further heated, and an intermetallic compound is produced between the Sn-based metal and the Cu-based metal composing the high melting point metal powder 7. In FIG. 1(3), a region where an intermetallic compound is produced is shown as an intermetallic compound region 9. When both of the connecting object 2 and the connecting object 3 are made of a Cu-based metal, an intermetallic compound is also produced between the Sn-based metal and the Cu-based metal composing the connecting objects 2 and 3.

A characteristic constitution of the present invention is, as described above, that at least a Cu—Sn intermetallic compound, a M-Sn intermetallic compound (M is Ni and/or Mn) and a Cu-M-Sn intermetallic compound exist in a cross-section of the connecting part 4 when the cross-section of the connecting part 4 including intermetallic compounds produced is analyzed with a wavelength dispersive X-ray spectrometer (WDX), and that when the cross-section of the connecting part 4 is evenly divided into ten sections in a vertical direction and a lateral direction, respectively, to form 100 segmentalized squares in total, a ratio (dispersion degree) of the number of squares in which two or more kinds of intermetallic compounds having different constituent elements exist to the number of all squares except for squares in which only the Sn-based metal component exists in one square, that is, the number of all squares in which the intermetallic compound exists, is 70% or more.

When at least three kinds of intermetallic compounds such as a Cu—Sn intermetallic compound, a M-Sn intermetallic compound and a Cu-M-Sn intermetallic compound exist in the cross-section of the connecting part 4 and the intermetallic compounds in the connecting part 4 are in a state of being well dispersed as the dispersion degree of the intermetallic compounds is 70% or more as described above, stress concentration hardly occurs, and therefore, as is apparent from experiment examples described later, even if the connecting part 4 is loaded with stress due to distortion resulting from a difference in the coefficient of linear expansion generated by thermal shock or the like, a crack is hardly produced, and this makes it possible that problems of an increase in resistance or deterioration of joint strength hardly arise.

The grains of Cu-M alloy having a relatively low Young's modulus such as Cu—Mn or Cu—Ni are preferably dispersed in the connecting part 4 in addition to the above-mentioned intermetallic compounds. The Cu-M alloy grains are derived from the high melting point metal powder 7. When the Cu-M alloy grains are thus dispersed, the connection reliability at the connecting part 4 can be improved by the effect of stress relaxation which these Cu-M alloy grains have.

In order to facilitate the production of the intermetallic compound, the probability of contact between the high melting point metal powder 7 and the Sn-based metal should be increased, and therefore the high melting point metal powder 7 desirably has a specific surface area of $0.05 \text{ m}^2 \cdot \text{g}^{-1}$ or more. Further, coating the circumference of the high melting point metal powder 7 with at least a part of the low melting point metal powder 6 also facilitates the production of an intermetallic compound.

In order to improve the heat resistance of the connecting part 4, preferably, the connecting part 4 does not contain a Sn-based metal component, and even if the connecting part 4 contains the Sn-based metal component, it is preferred that the content of the Sn-based metal component is set to 30% by volume or less. The Sn-based metal component can be remelted and flown out when being placed, for example, in a high-temperature environment of 300° C. or higher, leading to a reduction in the heat resistance of the connecting part 4. Therefore, by setting the content of the Sn-based metal component to 30% by volume or less, the heat resistance of the connecting part can be improved, and by forming the connecting part in such a way that it does not contain the Sn-based metal component, the heat resistance can be more improved. A lattice constant is involved in such a reduction of the content of the Sn-based metal component.

When the lattice constant of the Cu-based metal used in the present embodiment has a lattice constant difference of 50% or more from the lattice constant of an intermetallic compound first produced at the circumference of the low melting point metal powder 6 as described above, the intermetallic compound 8 repeats a reaction while peeling/dispersing in a melted body of the Sn-based metal composing the low melting point metal powder 6 to allow the production of the intermetallic compound to proceed rapidly, and therefore the content of a Sn-based metal component can be adequately reduced in a short time.

In association with the above description, when the proportion of the high melting point metal powder 6 in the metal component contained in the solder paste 5 is set to 30% by volume or more, it is effective in reducing the proportion of the Sn-based metal component remaining in the connecting part 4.

If the heat resistance of the connecting part 4 is improved, for example, in manufacturing a semiconductor device, even when a semiconductor device is manufactured after undergoing a step of soldering, and then the semiconductor device is mounted on a substrate by a reflow soldering method, a soldered part obtained by previous soldering can be made excellent in strength in high temperature and is not remelted in a step of reflow soldering, and therefore highly reliable mounting can be realized.

In addition, the solder may be the one not in the form of a paste described above, but the one in the form of a plate-like solid, for example.

[Second Embodiment]

Figure 2:
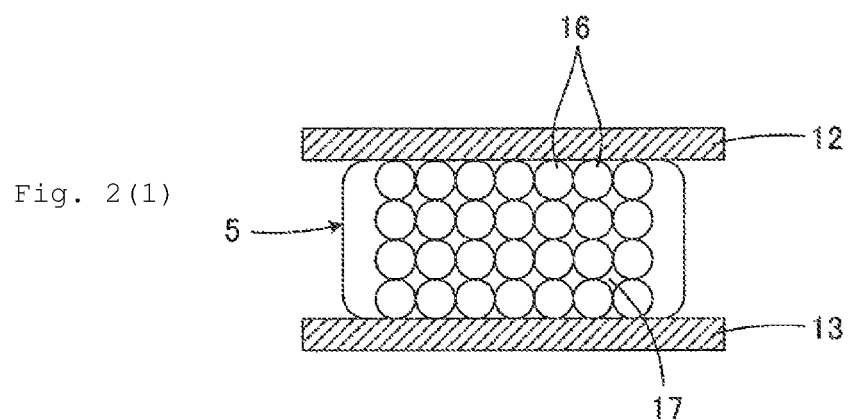
FIGS. 2(1) to 2(3) are sectional views schematically showing a connection structure 11 according to a second embodiment of the present invention, and a process for attaining the connection structure 11.
Figure 2:
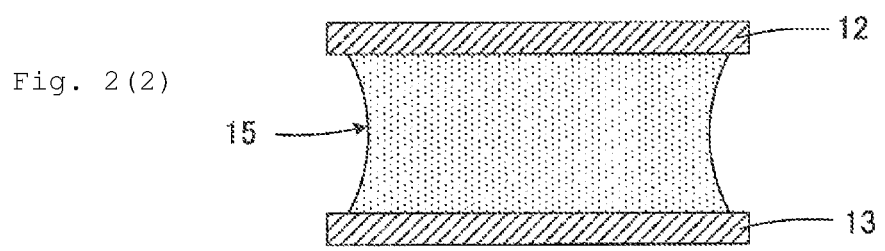
Figure 2:
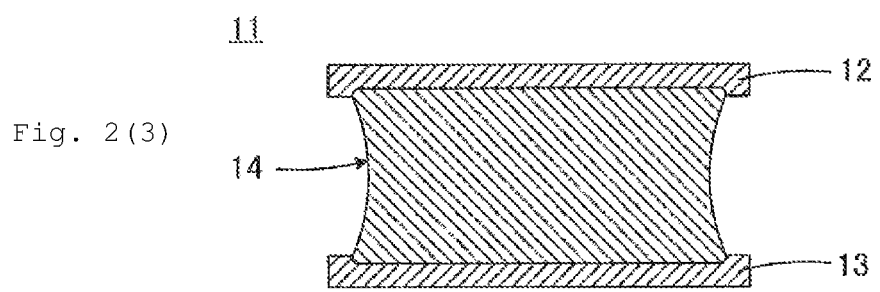

In reference to FIG. 2, a connection structure 11 according to a second embodiment of the present invention will be described. A connection structure 11 shown in FIG. 2(3) is obtained after undergoing the process from FIG. 2(1) to FIG. 2(2). As shown in FIG. 2(3), the connection structure 11 has a structure in which a first connecting object 12 is connected to a second connecting object 13 with a connecting part 14 interposed therebetween.

The second embodiment is characterized in that at least surfaces of the first connecting object 12 and the second connecting object 13 are respectively made of a Cu-based metal. In addition, as the Cu-based metal, the same Cu-based metals as those described in the above-mentioned first embodiment can be employed.

Further, in the second embodiment, a solder paste 15 provided between the first connecting object 12 and the second connecting object 13, shown in FIG. 2(1), includes a low melting point metal powder 16 of a Sn-based metal and a flux 17, and the second embodiment is characterized in that it is only necessary for the solder paste 15 to include only the low melting point metal powder 16 as a metal component. In addition, as the Sn-based metal, the same Sn-based metals as those described in the above-mentioned first embodiment can be employed.

In order to obtain the connection structure 11, first, the solder paste 15 is provided between the first connecting object 12 and the second connecting object 13, as shown in FIG. 2(1).

Next, the solder paste 15 is heated in the state shown in FIG. 2(1), and when the temperature of the solder paste 15 reaches the melting point of the Sn-based metal composing the low melting point metal powder 16 or higher, the low melting point metal powder 16 is melted as is evident from the state of the solder paste 15 shown in FIG. 2(2).

Thereafter, the solder paste 15 is further heated, and an intermetallic compound is produced between the Sn-based metal in the solder paste 15 and the Cu-based metal existing at least at the surfaces of the first and second connecting objects 12 and 13. Such an intermetallic compound exists in the connecting part 14 shown in FIG. 2(3).

Also in the second embodiment, at least a Cu—Sn intermetallic compound, a M-Sn intermetallic compound (M is Ni and/or Mn) and a Cu-M-Sn intermetallic compound exist in a cross-section of the connecting part 14 when the cross-section of the connecting part 14 including intermetallic compounds produced is analyzed with a wavelength dispersive X-ray spectrometer. Further, when the cross-section of the connecting part 14 is evenly divided into ten sections in a vertical direction and a lateral direction, respectively, to form 100 segmentalized squares in total, a ratio of the number of squares in which two or more kinds of intermetallic compounds having different constituent elements exist to the number of all squares except for squares in which only a Sn-based metal component exists in one square, that is, the number of all squares in which the intermetallic compound exists, is 70% or more.

Accordingly, stress concentration hardly occurs as with the first embodiment, and even if the connecting part 14 is loaded with stress due to distortion resulting from a difference in the coefficient of linear expansion generated by thermal shock or the like, a crack is hardly produced, and this makes it possible that problems of an increase in resistance or deterioration of joint strength hardly arise.

In addition, in the case of the second embodiment where the solder paste 15 does not contain a high melting point metal powder of a Cu-based metal, dispersion of grains of a Cu-M alloy such as a Cu—Mn alloy or a Cu—Ni alloy in the connecting part 14 does not occur.

Also in the second embodiment, the solder may be, for example, in the form of a plate-like solid, not in the form of a paste as described above.

Next, experiment examples carried out in order to verify the effect of the present invention will be described. The experiment examples were performed based on the first embodiment.

EXPERIMENT EXAMPLE 1

In Experiment Example 1, a solder paste was prepared by mixing a low melting point metal powder having a "Sn-based metal component" shown in Table 1, a high melting point metal powder having a "Cu-based Metal Component" shown in Table 1 and a flux.

The mixing ratio of the Sn-based metal component to the Cu-based metal component was adjusted so as to be 60/40 in terms of the volume ratio of the low melting point metal powder to the high melting point metal powder.

Further, as the flux, a mixture composed of rosin, diethylene glycol monobutyl ether, triethanol amine and hydrogenated castor oil in proportions of 74%:22%:2%:2% by volume was used. The mixing ratio of the flux was adjusted to 10% by weight with respect to the whole solder paste.

Figure 3:
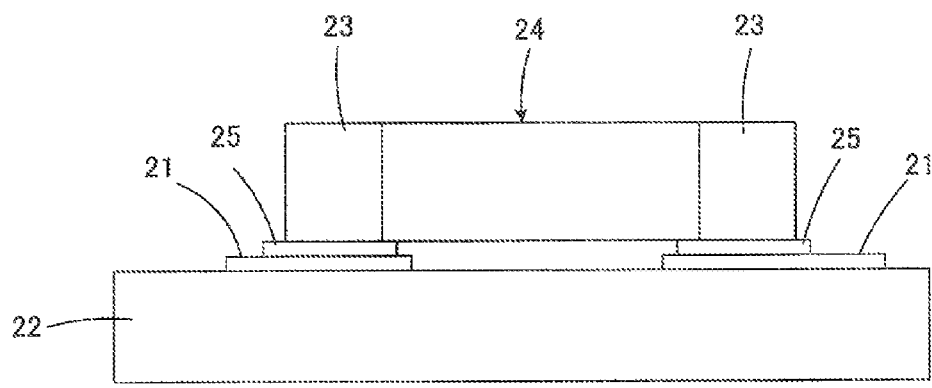
FIG. 3 is a front view showing a situation of mounting a laminated ceramic capacitor 24 having a connection structure prepared in an experiment example.

On the other hand, as shown in FIG. 3, a printed board 22 having a Cu land 21 having a size of 0.7 mm×0.4 mm was prepared, and a laminated ceramic capacitor 24 of 1 mm long, 0.5 mm wide and 0.5 mm thick having an external electrode 23 predominantly made of Cu was prepared.

Then, the solder paste 25 was applied onto the Cu land 21 in a thickness of 100 w, and then the laminated ceramic capacitor 24 was mounted on the printed board 22.

Figure 4:
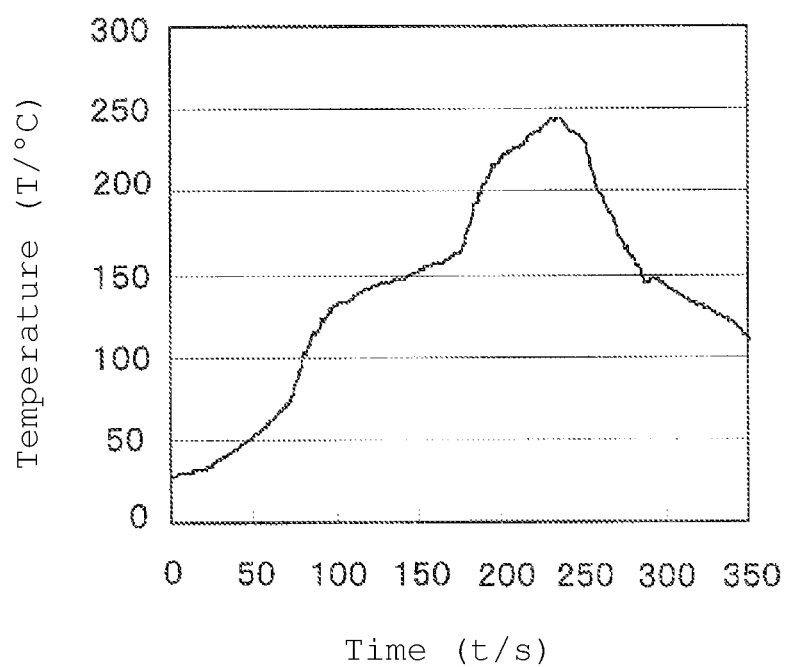
FIG. 4 is a graph showing reflow profiling employed in an experiment example.

Next, the Cu land 21 was soldered with the external electrode 23 along a reflow profile shown in FIG. 4 by using a reflow apparatus.

With respect to the samples thus prepared, in Table 1, "Lattice Constant" of "Cu-based Metal Component", "Composition" and "Lattice Constant" of "Intermetallic Compound First Produced", and "Lattice Constant Difference" are shown in addition to the compositions of the above-mentioned "Sn-based Metal Component" and "Cu-based Metal Component".

The "Intermetallic Compound First Produced" is an intermetallic compound first produced at an interface between the Sn-based metal component in the solder paste and the high melting point metal powder of a Cu-based metal, the Cu land or the external electrode of the laminated ceramic capacitor, and a cross-section of the connecting part was identified by mapping analysis by an FE-WDX. The "lattice constant" was determined on the basis of an a axis. The "lattice constant difference" is determined from the formula shown above.

In Table 1, typical examples of the intermetallic compound produced in the connecting part are shown in the column "Examples of Intermetallic Compounds Produced at Connecting Part". Accordingly, intermetallic compounds other than the intermetallic compounds shown in Table 1 can be produced in the connecting part. The intermetallic compounds produced in the connecting part were also identified by mapping analyzing the cross-section of the connecting part with an FE-WDX.

TABLE 1

| Sample No. | Sn-based Metal Component (60% by volume) | Cu-based Metal Component (40% by volume) | | Intermetallic Compound First Produced | | Difference in Lattice Constant (%) | Examples of Intermetallic Compounds Produced at Connecting Part |
|---|---|---|---|---|---|---|---|
| | | Composition | Lattice Constant a (nm) | Composition | Lattice Constant a (nm) | | |
| 1 | Sn—3Ag—0.5Cu | Cu—10Ni | 0.357 | $Cu_2NiSn$ | 0.597 | 67 | Cu—Ni—Sn/Ni—Sn/Cu—Sn/Ag—Sn |
| 2 | | Cu—10Mn | 0.367 | $Cu_2MnSn$ | 0.617 | 68 | Cu—Mn—Sn/Mn—Sn/Cu—Sn/Ag—Sn |
| 3 | Sn | | | | | | Cu—Mn—Sn/Mn—Sn/Cu—Sn |
| 4 | Sn—3.5Ag | | | | | | Cu—Mn—Sn/Mn—Sn/Cu—Sn/Ag—Sn |
| 5 | Sn—0.75Cu | | | | | | Cu—Mn—Sn/Mn—Sn/Cu—Sn |

TABLE 1-continued

| Sample No. | Sn-based Metal Component (60% by volume) | Cu-based Metal Component (40% by volume) Composition | Lattice Constant a (nm) | Intermetallic Compound First Produced Composition | Lattice Constant a (nm) | Difference in Lattice Constant (%) | Examples of Intermetallic Compounds Produced at Connecting Part |
|---|---|---|---|---|---|---|---|
| 6 | Sn—0.7Cu—0.05Ni | | | | | | Cu—Mn—Sn/Mn—Sn/Cu—Sn/Ni—Sn |
| 7 | Sn—5Sb | | | | | | Cu—Mn—Sn/Mn—Sn/Cu—Sn/Sn—Sb |
| 8 | Sn—2Ag—0.5Cu—2Bi | | | | | | Cu—Mn—Sn/Mn—Sn/Cu—Sn/Ag—Sn |
| 9 | Sn—3.5Ag—0.5Bi—8In | | | | | | Cu—Mn—Sn/Mn—Sn/ Cu—Sn/Ag—Sn/Sn—In |
| 10 | Sn—9Zn | | | | | | Cu—Mn—Sn/Mn—Sn/Cu—Sn |
| 11 | Sn—8Zn—3Bi | | | | | | Cu—Mn—Sn/Mn—Sn/Cu—Sn |
| 12 | Sn—10Bi | | | | | | Cu—Mn—Sn/Mn—Sn/Cu—Sn |
| 13 | Sn—20Bi | | | | | | Cu—Mn—Sn/Mn—Sn/Cu—Sn |
| 14 | Sn—30Bi | | | | | | Cu—Mn—Sn/Mn—Sn/Cu—Sn |
| 15 | Sn—3Ag—0.5Cu | Cu—12Mn—4Ni | 0.367 | $Cu_2MnSn$ | 0.617 | 68 | Cu—Mn—Sn/Mn—Sn/Cu—Sn/Ag—Sn |
| 16 | | Cu—10Mn—1P | 0.367 | $Cu_2MnSn$ | 0.617 | 68 | Cu—Mn—Sn/Mn—Sn/Cu—Sn/Ag—Sn |
| 17 | | Cu—10Ni (20% by volume) | 0.352 | $Cu_2NiSn$ | 0.597 | 67 | Cu—Mn—Sn/Mn—Sn/Cu—Sn/Ag—Sn |
| | | Cu—10Mn (20% by volume) | 0.367 | $Cu_2MnSn$ | 0.617 | 68 | |
| 18 | Sn—3Ag—0.5Cu | Cu | 0.361 | $Cu_3Sn$ | 0.432 | 20 | Cu—Sn/Ag—Sn |
| 19 | | Cu—10Zn | 0.359 | $Cu_3Sn$ | 0.432 | 20 | Cu—Sn/Ag—Sn |
| 20 | Sn—40Bi | Cu—10Mn | 0.367 | $Cu_3Sn$ | 0.432 | 18 | Cu—Mn—Sn/Mn—Sn/Cu—Sn |
| 21 | Sn—58Bi | Cu—10Mn | 0.357 | $Cu_3Sn$ | 0.432 | 21 | Cu—Mn—Sn/Mn—Sn/Cu—Sn |

The results of "dispersion degree", "existence or non-existence of crack", "rate of change in electric resistance", "joint strength", "evaluation of remaining component" and "evaluation of flow out" are shown in Table 2.

The "dispersion degree" was determined by the following procedure.

(1) In a photograph of the cross-section of the connecting part, the connecting part was evenly divided into ten sections in a vertical direction and a lateral direction, respectively, to form 100 segmentalized squares in total.

(2) The number of squares in which two or more kinds of intermetallic compounds exist in one square was counted.

(3) When there was a square in which the intermetallic compound did not exist among 100 segmentalized squares, the number of squares except for this square was defined as the number of all squares, and a value obtained by dividing the number of squares in which two or more kinds of intermetallic compounds existed in the above-mentioned (2) by the number of all squares and multiplying the obtained value by 100 was defined as a dispersion degree D1 (%).

The sample having the dispersion degree D1 of 70% or more was rated as "⊙" (excellent), and the sample having the dispersion degree D1 of less than 70% was rated as "x" (defective).

The "existence or non-existence of crack" was checked by observing a cross-section of the connecting part after the obtained samples were subjected to a thermal shock test in which a cycle of holding a sample for 30 minutes under the temperature conditions of −40° C. and +85° C., respectively was repeated a thousand times.

"Rate of Change in Electric Resistance" was evaluated by measuring the value of electric resistance of a sample before and after the thermal shock test to determine the rate of change between values of electric resistance measured before and after the thermal shock test. The sample having the rate of change in electric resistance of 30% or less was rated as "⊙" (excellent), and the sample having the rate of change in electric resistance of more than 30% was rated as "x" (defective).

"Joint Strength" was evaluated by measuring shear strength concerning a laminated ceramic capacitor on a printed board before and after the thermal shock test by using a bonding tester. Measurement of the shear strength was carried out at a lateral push rate of 0.1 mm/s. The sample having the shear strength of 10 $Nmm^{-2}$ or more was rated as "⊙" (excellent), and the sample having the shear strength of less than 10 $Nmm^{-2}$ was rated as "x" (defective).

In the "Evaluation of Remaining Component", a portion of about 7 mg of the connecting part of the obtained sample was cut off and analyzed at a temperature rise rate of 5° C./min at a measurement temperature of 30° C. to 300° C. in a nitrogen atmosphere using $Al_2O_3$ as a reference by using differential scanning calorimetry (DSC). The amount of the remaining Sn-based metal component was quantified from an endothermic quantity of an endothermic melting peak at a melting temperature of the Sn-based metal component in the resulting DSC chart. Then, the proportion of this Sn-based metal component to the whole metal components was determined as the proportion of the remaining Sn-based metal component from the amount of this Sn-based metal component. The case where the proportion of the remaining Sn-based metal component was 0 to 3% by volume was rated as "⊙" (excellent), the case where it was more than 3% by volume and 30% by volume or less was rated as "○" (good), and the case where it was more than 30% by volume was rated as "x" (defective).

In the "Evaluation of Flow Out", the printed boards of the obtained samples were sealed with an epoxy resin, left standing in an environment of 85% in relative humidity, and heated in the reflow condition of a peak temperature of 260° C. to determine the percentage of the samples in which the solder was flown out. This percentage was taken as the flow out percent defective. The case where the flow out percent defective was 0 to 10% was rated as "⊙" (excellent), the case where it was more than 10% and 50% or less was rated as "○" (good), and the case where it was more than 50% was rated as "x" (defective).

TABLE 2

| Sample No. | Dispersion Degree D1 (%) | Rating | Existence or Non-Existence of Crack | Rate of Change in Electric Resistance (%) Result | Rating | Joint Strength (Nmm$^{-2}$) Before Thermal Shock | After Thermal Shock | Rating | Evaluation of Remaining Component Proportion of Remaining Sn-based Metal Component (% by volume) | Rating | Evaluation of Flow Out Flow Out Percent Defective (%) | Rating |
|---|---|---|---|---|---|---|---|---|---|---|---|---|
| 1 | 85 | ⊙ | none | 0 | ⊙ | 28 | 28 | ⊙ | 0 | ⊙ | 0 | ⊙ |
| 2 | 100 | ⊙ | none | 0 | ⊙ | 28 | 27 | ⊙ | 0 | ⊙ | 0 | ⊙ |
| 3 | 100 | ⊙ | none | 0 | ⊙ | 29 | 29 | ⊙ | 0 | ⊙ | 0 | ⊙ |
| 4 | 100 | ⊙ | none | 0 | ⊙ | 27 | 27 | ⊙ | 0 | ⊙ | 0 | ⊙ |
| 5 | 100 | ⊙ | none | 0 | ⊙ | 27 | 27 | ⊙ | 0 | ⊙ | 0 | ⊙ |
| 6 | 100 | ⊙ | none | 0 | ⊙ | 28 | 27 | ⊙ | 0 | ⊙ | 0 | ⊙ |
| 7 | 100 | ⊙ | none | 0 | ⊙ | 30 | 29 | ⊙ | 0 | ⊙ | 0 | ⊙ |
| 8 | 100 | ⊙ | none | 0 | ⊙ | 29 | 28 | ⊙ | 0 | ⊙ | 0 | ⊙ |
| 9 | 100 | ⊙ | none | 0 | ⊙ | 28 | 29 | ⊙ | 0 | ⊙ | 0 | ⊙ |
| 10 | 100 | ⊙ | none | 0 | ⊙ | 27 | 27 | ⊙ | 0 | ⊙ | 0 | ⊙ |
| 11 | 100 | ⊙ | none | 0 | ⊙ | 27 | 27 | ⊙ | 0 | ⊙ | 0 | ⊙ |
| 12 | 100 | ⊙ | none | 0 | ⊙ | 28 | 27 | ⊙ | 0 | ⊙ | 0 | ⊙ |
| 13 | 91 | ⊙ | none | 0 | ⊙ | 28 | 31 | ⊙ | 11 | ○ | 4 | ○ |
| 14 | 78 | ⊙ | none | 0 | ⊙ | 29 | 34 | ⊙ | 15 | ○ | 6 | ○ |
| 15 | 100 | ⊙ | none | 0 | ⊙ | 28 | 28 | ⊙ | 0 | ⊙ | 0 | ⊙ |
| 16 | 100 | ⊙ | none | 0 | ⊙ | 29 | 29 | ⊙ | 0 | ⊙ | 0 | ⊙ |
| 17 | 96 | ⊙ | none | 0 | ⊙ | 28 | 27 | ⊙ | 0 | ⊙ | 0 | ⊙ |
| 18 | 14 | X | existed | 100 | X | 25 | 7 | X | 31 | X | 75 | X |
| 19 | 16 | X | existed | 100 | X | 31 | 9 | X | 34 | X | 70 | X |
| 20 | 55 | X | existed | 100 | X | 28 | 7 | X | 32 | X | 71 | X |
| 21 | 46 | X | existed | 100 | X | 27 | 8 | X | 36 | X | 76 | X |

In Table 1 and Table 2, the samples 18 to 21 are comparative examples out of the scope of the present invention.

In each of the samples 1 to 17 within the scope of the present invention, as is evident from "Examples of Intermetallic Compounds Produced at Connecting Part" in Table 1, at least a Cu—Sn intermetallic compound, a M-Sn intermetallic compound (M is Ni and/or Mn) and a Cu-M-Sn intermetallic compound existed, and with respect to "Dispersion Degree" in Table 2, D1 exhibited a value of 70% or more.

Consequently, in each of the samples 1 to 17, as shown in Table 2, with respect to "Existence or Non-Existence of Crack", production of a crack was not found, "Rate of Change in Electric Resistance" was 0%, and "Joint Strength" was 27 Nmm$^{-2}$ or more in both cases of "Before Thermal Shock" and "After Thermal Shock", and it was found that these samples have high thermal shock resistance.

On the other hand, in each of the samples 18 and 19 out of the scope of the present invention, with respect to "Dispersion Degree" in Table 2, D1 was significantly less than 70%. Further, in each of the samples 20 and 21 out of the scope of the present invention, as is evident from "Examples of Intermetallic Compounds Produced at Connecting Part" in Table 1, at least a Cu—Sn intermetallic compound, a M-Sn intermetallic compound and a Cu-M-Sn intermetallic compound existed, but with respect to "Dispersion Degree" in Table 2, D1 was less than 70%.

Consequently, in each of the samples 18 to 21, as shown in Table 2, with respect to "Existence or Non-Existence of Crack", production of a crack was found, "Rate of Change of Electric Resistance" was 100%, and "Joint Strength" was less than 10 Nmm$^{-2}$ in the case of "After Thermal Shock".

It is presumed from the results described above that the samples 1 to 17 within the scope of the present invention exhibited high thermal shock resistance since at least a Cu—Sn intermetallic compound, a M-Sn intermetallic compound and a Cu-M-Sn intermetallic compound were produced with a high dispersion degree, and in this case, stress generated due to thermal shock is hardly concentrated into a part and is dispersed to be mitigated compared with the case where the intermetallic compound is only partially produced as with the samples 18 to 21.

Herein, it is particularly important that the "intermetallic compound first produced" contains a Cu-M-Sn intermetallic compound, and that the "dispersion degree D1" is 70% or more. When metal Sn in which the content of Sn is 100%, or a Sn alloy in which the content of Sn is 70% or more is used as a Sn-based metal component, and a substance including Cu-M is used as a Cu-based metal component as with the samples 1 to 17, the "intermetallic compound first produced" comes to include a Cu-M-Sn intermetallic compound by the reaction of both metal components. Since the Cu-M-Sn intermetallic compound has a large lattice constant difference from the Cu-M alloy, a process, in which the Cu-M-Sn intermetallic compound is easily peeled off from a Cu-M alloy portion in the Sn-based metal and dispersed, and the Cu-M alloy portion newly exposed by peeling reacts with the Sn-based metal, is frequently and rapidly repeated. As a result of this, a connection structure in which the "dispersion degree D1" is 70% or more is obtained.

Further, in the samples 1 to 17, it is thought that since the connecting part contains Cu—Ni and/or Cu—Mn alloy grains which are derived from the high melting point metal powder in the solder paste and have a relatively low Young's modulus, as is evident from "Cu-based Metal Component" shown in Table 1, and these alloy grains are dispersed in the connecting part, this brings the effect of stress relaxation, and thereby thermal shock resistance is improved.

Further, when production and peeling of the intermetallic compound are frequently and rapidly repeated like in the samples 1 to 17, as is evident from "Evaluation of Remaining Component" in Table 2, the "Proportion of Remaining Sn-based Metal Component" could be reduced to 30% by volume or less, and more specifically 15% by volume or less. The reduction of the "Proportion of Remaining Sn-based Metal Component" leads to an improvement of strength in high temperature of the connecting part. Therefore, when the samples 1 to 17 were used, "Flow Out Percent Defective" could be reduced to 50% or less, and more specifically 10% or less.

On the other hand, in each of the samples 18 to 21, "Proportion of Remaining Sn-based Metal Component" exceeded 30% by volume, and hence "Flow Out Percent Defective" exceeded 50%.

Figure 5:
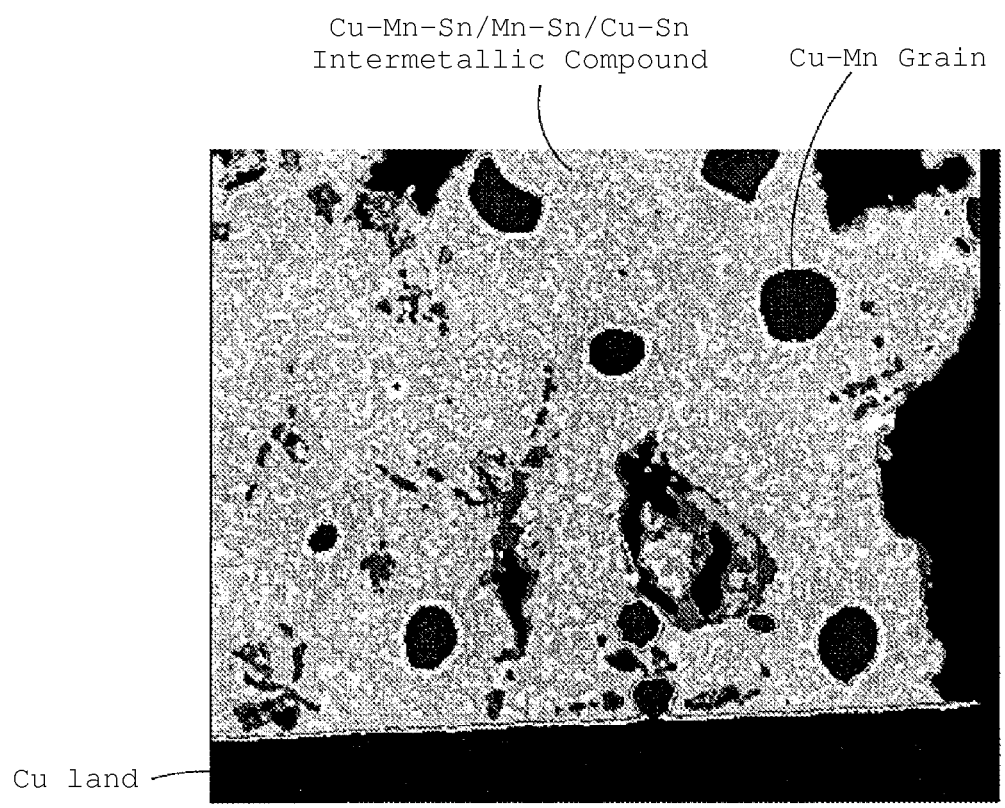
FIG. 5 shows a magnified photograph of a joining structure of a sample 3 prepared in an experiment example.
Figure 6:
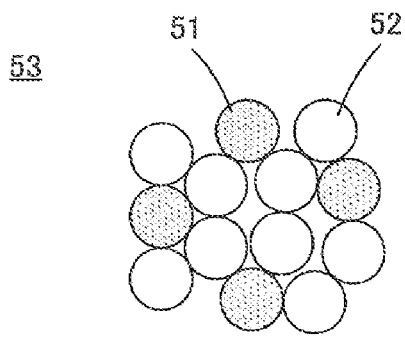
FIGS. 6(1) and 6(2) are drawings showing the behavior of a solder in soldering by using the solder paste 53 described in Patent Document 1, wherein FIG. 6(1) is a drawing showing a state of the solder before heating and FIG. 6(2) is a drawing showing a state of the solder after the completion of a soldering step.
Figure 6:
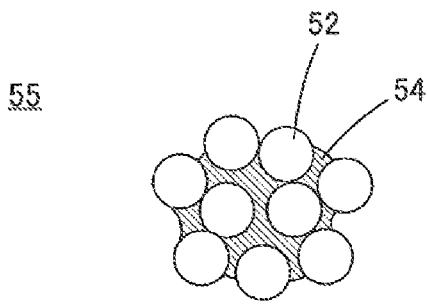
Figure 7:
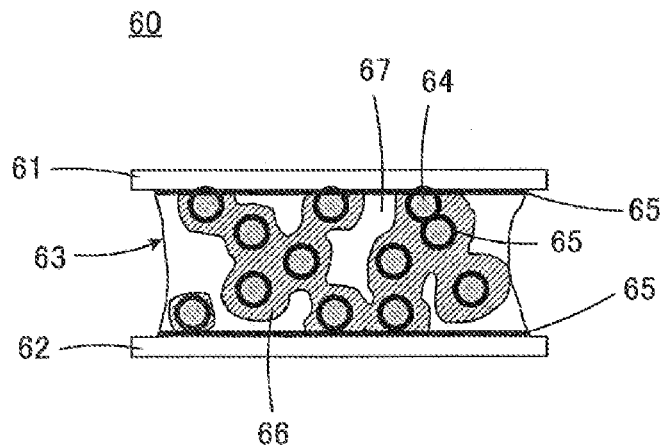
FIG. 7 is a drawing for explaining the problem of the solder paste described in Patent Document 1, and is a sectional view schematically showing a connection structure 60 in which a first connecting object 61 and a second connecting object 62, respectively made of Cu, are connected to each other with a connecting part 63 interposed therebetween.

FIG. 5 is a magnified photograph of a joining structure of the sample 3 prepared in Experiment Example 1. In FIG. 5, a Cu land on a printed board is located along a bottom side of the photograph, and cross-section structure of the connecting part appears thereon. In the connecting part, a state can be observed, in which a plurality of Cu—Mn grains as a high melting point metal powder are distributed in a matrix where at least a Cu—Mn—Sn intermetallic compound, a Mn—Sn intermetallic compound and a Cu—Sn intermetallic compound exist.

EXPERIMENT EXAMPLE 2

In Experiment Example 2, as shown in Table 3, the ratio of the "Sn-based Metal Component" to the "Cu-based Metal Component" was varied while maintaining use of "Sn-3Ag-0.5Cu" as the "Sn-based Metal Component", and a sample was prepared by the same operations as in Experiment Example 1, and the sample was evaluated in the same way as in Experiment Example 1.

TABLE 3

| | Metal Component in Solder Paste | | | | | |
|---|---|---|---|---|---|---|
| Sample No. | Sn-based Metal Component Sn—3Ag—0.5Cu Percentage (% by volume) | Cu-based Metal Component Percentage (% by volume) | Examples of Intermetallic Compounds Produced at Connecting Part | Dispersion Degree D1 (%) | Rating | Existence or Non-Existence of Crack |
| 31 | 57.1 | Cu—10Mn | 42.9 Cu—Mn—Sn/ | 100 | ⊙ | none |
| 32 | 66.7 | | 33.3 Mn—Sn/ | 100 | ⊙ | none |
| 33 | 70.0 | | 30.0 Cu—Sn/ | 100 | ⊙ | none |
| 34 | 72.7 | | 27.3 Ag—Sn | 100 | ⊙ | none |
| 35 | 79.9 | | 20.1 | 100 | ⊙ | none |
| 36 | 84.2 | | 15.8 | 100 | ⊙ | none |
| 37 | 86.9 | | 13.1 | 100 | ⊙ | none |
| 38 | 63.1 | Cu—10Ni | 36.9 Cu—Ni—Sn/ | 85 | ⊙ | none |
| 39 | 70.0 | | 30.0 Ni—Sn/ | 88 | ⊙ | none |
| 40 | 83.7 | | 16.3 Cu—Sn/ Ag—Sn | 74 | ⊙ | none |
| 41 | 57.1 | Cu | 42.9 Cu—Sn/Ag—Sn | 14 | X | existed |
| 42 | 66.7 | | 33.3 | 13 | X | existed |
| 43 | 72.7 | | 27.3 | 15 | X | existed |
| 44 | 79.9 | | 20.1 | 11 | X | existed |
| 45 | 84.2 | | 15.8 | 11 | X | existed |
| 46 | 86.9 | | 13.1 | 11 | X | existed |

| | Rate of Change in Electric Resistance | | Joint Strength (Nmm$^{-2}$) | | | Evaluation of Remaining Component Proportion of Remaining Sn-based Metal Component | | Evaluation of Flow Out Flow Out Percent | |
|---|---|---|---|---|---|---|---|---|---|
| Sample No. | Result (%) | Rating | Before Thermal Shock | After Thermal Shock | Rating | (% by volume) | Rating | Defective (%) | Rating |
| 31 | 0 | ⊙ | 25 | 25 | ⊙ | 0 | ⊙ | 0 | ⊙ |
| 32 | 0 | ⊙ | 28 | 27 | ⊙ | 0 | ⊙ | 0 | ⊙ |
| 33 | 0 | ⊙ | 30 | 30 | ⊙ | 0 | ⊙ | 0 | ⊙ |
| 34 | 0 | ⊙ | 31 | 33 | ◯ | 11 | ◯ | 11 | ◯ |
| 35 | 0 | ⊙ | 29 | 34 | ◯ | 16 | ◯ | 14 | ◯ |
| 36 | 0 | ⊙ | 27 | 35 | ◯ | 21 | ◯ | 21 | ◯ |
| 37 | 0 | ⊙ | 27 | 31 | ◯ | 26 | ◯ | 49 | ◯ |
| 38 | 0 | ⊙ | 30 | 29 | ⊙ | 0 | ⊙ | 0 | ⊙ |

TABLE 3-continued

| 39 | 0   | ⊙ | 33 | 29 | ⊙ | 0  | ⊙ | 0  | ⊙ |
| 40 | 0   | ⊙ | 27 | 30 | ○ | 23 | ○ | 11 | ○ |
| 41 | 100 | X | 25 | 7  | X | 31 | X | 75 | X |
| 42 | 100 | X | 25 | 9  | X | 40 | X | 71 | X |
| 43 | 100 | X | 29 | 7  | X | 47 | X | 80 | X |
| 44 | 100 | X | 29 | 9  | X | 53 | X | 79 | X |
| 45 | 100 | X | 30 | 9  | X | 60 | X | 81 | X |
| 46 | 100 | X | 28 | 8  | X | 74 | X | 85 | X |

In Table 3, the samples 41 to 46 are comparative examples out of the scope of the present invention.

In each of the samples 31 to 40 within the scope of the present invention, as is evident from "Examples of Intermetallic Compounds Produced at Connecting Part", at least a Cu—Sn intermetallic compound, a M-Sn intermetallic compound (M is Ni and/or Mn) and a Cu-M-Sn intermetallic compound existed, and with respect to "Dispersion Degree", at least D1 exhibited a value of 70% or more.

Consequently, in each of the samples 31 to 40, with respect to "Existence or Non-Existence of Crack", production of a crack was not found, "Rate of Change in Electric Resistance" was 0%, and "Joint Strength" was 25 Nmm$^{-2}$ or more in both cases of "Before Thermal Shock" and "After Thermal Shock", and it was found that these samples have high thermal shock resistance.

On the other hand, in the samples 41 to 46 out of the scope of the present invention, with respect to "Dispersion Degree" in Table 2, D1 was significantly less than 70%.

Consequently, in each of the samples 41 to 46, with respect to "Existence or Non-Existence of Crack", production of a crack was found, "Rate of Change in Electric Resistance" was 100%, and "Joint Strength" was less than 10 Nmm$^{-2}$ in the case of "After Thermal Shock".

In the samples 31 to 40, it is thought that since Cu—Mn or Cu—Ni alloy grains having a low Young's modulus were used as the high melting point metal powder in the solder paste as described in the column "Ratio of Cu-based Metal Component", this brings the effect of stress relaxation, and thereby thermal shock resistance is improved.

Further, in each of the samples 31 to 40, "Proportion of Remaining Sn-based Metal Component" could be reduced to 30% by volume or less, and hence "Flow Out Percent Defective" could be reduced to 50% or less.

On the other hand, in each of the samples 41 to 46, "Proportion of Remaining Sn-based Metal Component" exceeded 30% by volume, and hence "Flow Out Percent Defective" exceeded 50%.

In addition, when performing a comparison among the samples 31 to 40, a tendency that "Proportion of Remaining Sn-based Metal Component" increases with the increasing proportion of "Sn-based Metal Component" and hence "Flow Out Percent Defective" becomes high can be found out.

EXPERIMENT EXAMPLE 3

In Experiment Example 3, as shown in Table 4, the composition of "Cu-based Metal Component" was varied while maintaining use of "Sn-3Ag-0.5Cu" as "Sn-based Metal Component" and maintaining the volume ratio of "Sn-based Metal Component" to "Cu-based Metal Component" at 60/40, and a sample was prepared by the same operations as in Experiment Example 1, and the sample was evaluated in the same way as in Experiment Example 1.

TABLE 4

| Sample No. | Sn-based Metal Component (60% by volume) | Cu-based Metal Component (40% by volume) | Example of Intermetallic Compounds Produced at Connecting Part | Dispersion Degree D1 (%) | | Existence or Non-Existence of Crack |
|---|---|---|---|---|---|---|
| | | | | | Rating | |
| 51 | Sn—3Ag—0.5Cu | Cu—5Mn  | Cu—Mn—Sn/Mn—Sn/Cu—Sn/Ag—Sn | 95  | ⊙ | none |
| 52 |              | Cu—10Mn | Cu—Mn—Sn/Mn—Sn/Cu—Sn/Ag—Sn | 100 | ⊙ | none |
| 53 |              | Cu—15Mn | Cu—Mn—Sn/Mn—Sn/Cu—Sn/Ag—Sn | 98  | ⊙ | none |
| 54 |              | Cu—20Mn | Cu—Mn—Sn/Mn—Sn/Cu—Sn/Ag—Sn | 97  | ⊙ | none |
| 55 |              | Cu—30Mn | Cu—Mn—Sn/Mn—Sn/Cu—Sn/Ag—Sn | 77  | ⊙ | none |
| 56 |              | Cu—5Ni  | Cu—Mn—Sn/Mn—Sn/Cu—Sn/Ag—Sn | 79  | ⊙ | none |
| 57 |              | Cu—10Ni | Cu—Mn—Sn/Mn—Sn/Cu—Sn/Ag—Sn | 85  | ⊙ | none |
| 58 |              | Cu—15Ni | Cu—Mn—Sn/Mn—Sn/Cu—Sn/Ag—Sn | 79  | ⊙ | none |
| 59 |              | Cu—20Ni | Cu—Mn—Sn/Mn—Sn/Cu—Sn/Ag—Sn | 72  | ⊙ | none |
| 60 |              | Cu      | Cu—Sn/Ag—Sn                 | 14  | X | existed |

TABLE 4-continued

| Sample No. | Rate of Change in Electric Resistance (%) Result | Rating | Joint Strength (Nmm$^{-2}$) Before Thermal Shock | After Thermal Shock | Rating | Evaluation of Remaining Component Proportion of Remaining Sn-based Metal Component (% by volume) | Rating | Evaluation of Flow Out Flow Out Percent Defective (%) | Rating |
|---|---|---|---|---|---|---|---|---|---|
| 51 | 0 | ⊙ | 28 | 34 | ○ | 19 | ○ | 32 | ○ |
| 52 | 0 | ⊙ | 28 | 27 | ⊙ | 0 | ⊙ | 0 | ⊙ |
| 53 | 0 | ⊙ | 28 | 28 | ⊙ | 0 | ⊙ | 0 | ⊙ |
| 54 | 0 | ⊙ | 30 | 33 | ○ | 9 | ○ | 15 | ○ |
| 55 | 0 | ⊙ | 31 | 36 | ○ | 21 | ○ | 35 | ○ |
| 56 | 0 | ⊙ | 28 | 31 | ○ | 12 | ○ | 26 | ○ |
| 57 | 0 | ⊙ | 28 | 28 | ⊙ | 0 | ⊙ | 0 | ⊙ |
| 58 | 0 | ⊙ | 29 | 27 | ⊙ | 0 | ⊙ | 0 | ⊙ |
| 59 | 0 | ⊙ | 30 | 34 | ○ | 5 | ○ | 12 | ○ |
| 60 | 100 | X | 25 | 7 | X | 31 | X | 75 | X |

In Table 4, the sample 60 is a comparative example out of the scope of the present invention.

In each of the samples 51 to 59 within the scope of the present invention, as is evident from "Examples of Intermetallic Compounds Produced at Connecting Part", at least a Cu—Sn intermetallic compound, a M-Sn intermetallic compound (M is Ni and/or Mn) and a Cu-M-Sn intermetallic compound existed, and with respect to "Dispersion Degree", at least D1 exhibited a value of 70% or more.

Consequently, in each of the samples 51 to 59, with respect to "Existence or Non-Existence of Crack", production of a crack was not found, "Rate of Change in Electric Resistance" was 0%, and "Joint Strength" was more than 25 Nmm$^{-2}$ in both cases of "Before Thermal Shock" and "After Thermal Shock", and it was found that these samples have high thermal shock resistance.

On the other hand, in the sample 60 out of the scope of the present invention, with respect to "Dispersion Degree" in Table 2, D1 was significantly less than 70%.

Consequently, in the sample 60, with respect to "Existence or Non-Existence of Crack", production of a crack was found, "Rate of Change in Electric Resistance" was 100%, and "Joint Strength" was less than 10 Nmm$^{-2}$ in the case of "After Thermal Shock".

Further, in the samples 51 to 59, it is thought that since Cu—Mn or Cu—Ni alloy grains having a low Young's modulus were used as the high melting point metal powder in the solder paste as described in the column "Cu-based Metal Component", this brings the effect of stress relaxation, and thereby thermal shock resistance is improved.

Further, in each of the samples 51 to 59, "Proportion of Remaining Sn-based Metal Component" could be reduced to 30% by volume or less, and hence "Flow Out Percent Defective" could be reduced to 50% or less.

On the other hand, in the sample 60, "Proportion of Remaining Sn-based Metal Component" exceeded 30% by volume, and hence "Flow Out Percent Defective" exceeded 50%.

DESCRIPTION OF REFERENCE NUMERALS 1, 11 connection structure
2, 3, 12, 13 connecting object
4, 14 connecting part
5, 15, 25 solder paste
6, 16 low melting point metal powder
7 high melting point metal powder
8, 17 flux
21 Cu land
22 printed board
23 external electrode
24 laminated ceramic capacitor

The invention claimed is:

1. A connection structure in which a first connecting object is connected to a second connecting object, the connection structure comprising:
    a connecting part interposed between the first connecting object and the second connecting object, the connecting part having at least a Cu—Sn intermetallic compound, a M-Sn intermetallic compound and a Cu-M-Sn intermetallic compound existing in a cross-section of the connecting part when the cross-section of the connecting part is analyzed with a wavelength dispersive X-ray spectrometer; and
    Cu-M alloy grains dispersed in the connecting part,
    wherein M is at least one of Ni and Mn,
    the Cu-M alloy grains are at least one of Cu—Mn alloy grains in which the Mn is 5 to 30% by weight and Cu—Ni alloy grains in which the Ni is 5 to 20% by weight, and
    when the cross-section of the connecting part is divided into ten sections in a vertical direction and a lateral direction, respectively, to form 100 segmentalized squares in total, a ratio of a first number of squares in which two or more of the Cu—Sn intermetallic compound, the M-Sn intermetallic compound and the Cu-M-Sn intermetallic compound exist to a second number of all squares, except for squares in which only a Sn-based metal component exists, is 70% or more.

2. The connection structure according to claim 1, wherein the connecting part contains the Sn-based metal component in an amount of 30% by volume or less.

3. The connection structure according to claim 1, wherein no squares contain the Sn-based metal component.

4. A connection structure comprising:
    a first connecting object;
    a second connecting object; and a connecting part interposed between the first connecting object and the second connecting object, the connecting part having at least a Cu—Sn intermetallic compound, a M-Sn intermetallic compound, a Cu-M-Sn intermetallic compound existing in a cross-section of the connecting part when the cross-section of the connecting part is analyzed with a wavelength dispersive X-ray spectrometer, and Cu-M alloy grains dispersed in the connecting part, wherein M is at least one of Ni and Mn, the Cu-M alloy grains are at least one of Cu—Mn alloy, grains in which the Mn is 5 to 30% by weight and Cu—Ni alloy grains in which the Ni is 5 to 20% by weight, and when the cross-section of the connecting part is divided into ten sections in a vertical direction and a lateral direction, respectively, to form 100 segmentalized squares in total, a ratio of a first number of squares in which two or more of the Cu—Sn intermetallic compound, the M-Sn intermetallic compound and the Cu-M-Sn intermetallic compound exist to a second number of all squares, except for squares in which only a Sn-based metal component exists, is 70% or more.

5. The connection structure according to claim 4, wherein the connecting part contains the Sn-based metal component in an amount of 30% by volume or less.

6. The connection structure according to claim 4, wherein no squares contain the Sn-based metal component.

7. The connection structure according to claim 4, wherein a first surface of the first connecting object and a second surface of the second connecting object contain a Cu-based metal.

8. The connection structure according to claim 7, wherein the Cu-based metal is at least one of a Cu—Mn alloy and a Cu—Ni alloy.

9. The connection structure according to claim 8, wherein the Cu-based metal is the Cu—Mn alloy, and a proportion of Mn in the alloy is 10 to 15% by weight.

10. The connection structure according to claim 8, wherein the Cu-based metal is the Cu—Ni alloy, and a proportion of Ni in the alloy is 10 to 15% by weight.

* * * * *